United States Patent [19]

Kimura

[11] Patent Number: 5,977,760
[45] Date of Patent: Nov. 2, 1999

[54] BIPOLAR OPERATIONAL TRANSCONDUCTANCE AMPLIFIER AND OUTPUT CIRCUIT USED THEREFOR

[75] Inventor: Katsuji Kimura, Tokyo, Japan

[73] Assignee: NEC Corporation, Tokyo, Japan

[21] Appl. No.: 08/929,772

[22] Filed: Sep. 15, 1997

[30] Foreign Application Priority Data

Sep. 13, 1996 [JP] Japan ................................. 8-265217

[51] Int. Cl.$^6$ ....................................................... G05F 3/16
[52] U.S. Cl. ........................................... 323/316; 323/313
[58] Field of Search .................................. 323/316, 313, 323/314, 315

[56] References Cited

U.S. PATENT DOCUMENTS

| | | | |
|---|---|---|---|
| 3,899,744 | 8/1975 | Kominami | 330/252 |
| 4,182,962 | 1/1980 | Taguchi et al. | 307/254 |
| 4,536,702 | 8/1985 | Nagano | 323/316 |
| 4,684,880 | 8/1987 | Chan | 323/316 |
| 4,864,248 | 9/1989 | Jansen | 330/254 |
| 4,942,369 | 7/1990 | Nakagawara et al. | 323/316 |
| 5,241,227 | 8/1993 | Jung et al. | 323/316 |
| 5,349,285 | 9/1994 | Okanobu | 323/312 |
| 5,442,311 | 8/1995 | Trafton | 327/306 |
| 5,644,217 | 7/1997 | Kusaba | 323/315 |

FOREIGN PATENT DOCUMENTS

| | | | |
|---|---|---|---|
| 0215216 | 3/1987 | European Pat. Off. | H03F 3/45 |
| 0616423 | 9/1994 | European Pat. Off. | H03F 3/45 |
| 0696847 | 2/1996 | European Pat. Off. | H03H 11/02 |

OTHER PUBLICATIONS

Barrie Gilbert, "A Precise Four–Quadrant Multiplier with Subnanosecond Response", *IEEE Journal of Solid–State Circuits*, vol. SC–3, No. 4, Dec. 1968, pp. 365–373.

*Primary Examiner*—Peter S. Wong
*Assistant Examiner*—Bao Q. Vu
*Attorney, Agent, or Firm*—Sughrue, Mion, Zinn Macpeak & Seas, PLLC

[57] ABSTRACT

A bipolar OTA having an improved S/N level is provided, which includes first, second, and third balanced differential pairs. The first balanced differential pair is formed by first and second bipolar transistors whose emitters are connected to one another through a common emitter resistor. The first and second transistors are driven by corresponding constant current sources/sinks, respectively. The second balanced differential pair is formed by third and fourth transistors whose emitters are coupled together to be connected to a collector of the first transistor. The third balanced differential pair is formed by fifth and sixth transistors whose emitters are coupled together to be connected to a collector of the second transistor. The third and fourth balanced differential pairs are driven by the collector currents of the first and second transistors, respectively. A control voltage is applied across bases of the third and fourth transistors and bases of the fifth and sixth transistors. A balanced differential input voltage is applied across bases of the first and second transistors. An OTA output is derived from at least one of the collectors of the third and fifth transistors.

10 Claims, 4 Drawing Sheets

BIPOLAR OPERATIONAL TRANSCONDUCTANCE AMPLIFIER AND OUTPUT CIRCUIT USED THEREFOR

BACKGROUND OF THE INVENTION

1. Field of the Invention

The present invention relates to a differential amplifier circuit comprised of bipolar transistors and more particularly, to an operational transconductance amplifier using bipolar transistors, which has an improved signal-to-noise ratio (S/N) and which is suitable for a semiconductor integrated circuit (IC), and an output circuit used for the amplifier.

2. Description of the Prior Art

A differential amplifier circuit having a superior transconductance linearity within a comparatively wide input voltage range has been known as an "Operational Transconductance Amplifier (OTA)".

A conventional bipolar OTA is shown in FIG. 1, which is termed the "Gilbert gain cell,". This conventional OTA was disclosed in IEEE Journal of Solid-State Circuits, Vol. SC-3, No. 4, December 1968, which was written by B. Gilbert.

As shown in FIG. 1, a first balanced differential pair is formed by two npn bipolar transistors Q101 and Q102. An emitter of the transistor Q101 is connected to one terminal of a constant current sink 101 sinking a constant current $I_0$. An emitter of the transistor Q102 is connected to one terminal of another constant current sink 102 sinking the same constant current $I_0$ as that of the current sink 101 for the transistor Q101. The other terminals of the two current sinks 101 and 102 are connected to the ground. The two transistors Q101 and Q102 are driven by the corresponding current sinks 101 and 102, respectively.

The emitters of the transistors Q101 and Q102 are coupled together through a common emitter resistor R101 having a resistance R.

A differential input voltage $V_i$ as an input signal to the conventional OTA is applied across bases of the transistors Q101 and Q102.

Two diode-connected npn bipolar transistors Q103 and Q104 are provided to serve as loads of the transistors Q101 and Q102, respectively. Specifically, emitters of the transistors Q103 and Q104 are connected to collectors of the transistors Q101 and Q102, respectively. A bass and a collector of the transistor Q103 are coupled together to be applied with a power supply voltage $V_{CC}$. A base and a collector of the transistor Q104 are coupled together to be applied with the same power supply voltage $V_{CC}$.

A second balanced differential pair is formed by two npn bipolar transistors Q105 and Q106. Emitters of the transistors Q105 and Q106 are coupled together to be connected to one terminal of a constant current sink 103 sinking a constant current $I_1$. The other terminal of the current sink 103 is connected to the ground. Bases of the transistors Q105 and Q106 are connected to the collectors of the transistors Q102 and Q101 serving as output terminals of the first balanced differential pair, respectively.

Here, a differential output current $\Delta I_C$, which is an amplified output signal of the OTA, is defined as the difference between collector currents $I_{C105}$ and $I_{C106}$ of the transistors Q105 and Q106, i.e., $\Delta I_C = I_{C105} - I_{C106}$. Then, the differential output current $\Delta I_C$ is derived from the collectors of the transistors Q105 and Q106.

Next, the operation of the conventional Gilbert gain cell shows in FIG. 1 is explained below.

Here, supposing that the base-width modulation (i.e., the Early voltage) is ignored and that the common-base current gain factor of a bipolar transistor is equal to unity, a collector current $I_C$ a bipolar transistor is typically given as the following expression (1a).

$$I_C = I_S \exp\left(\frac{V_{BE}}{V_T}\right) \tag{1a}$$

In the expression (1a) $V_{BE}$ is a base-to-emitter voltage of the bipolar transistor, and $I_S$ is the saturation current thereof. Also, $V_T$ is the thermal voltage defined as $V_T = kT/q$, where k is the Boltzmann's constant, T is absolute temperature in degrees Kelvin, and q is the charge of an electron.

The expression (1a) can be rewritten to the following form (1b).

$$V_{BE} = V_T \ln\left(\frac{I_C}{I_S}\right) \tag{1b}$$

When the differential input voltage $V_i$ is applied across the bases of the transistors Q101 and Q102 of the first balanced differential pair, the following relationship (2) is established around the loop consisting of the input voltage and the two base-emitter junctions of the transistors Q101 and Q102 because of the Kirchhoff's voltage law $$V_i = V_{BE101} - V_{BE102} + Ri \tag{2}$$

where $V_{BE101}$ and $V_{BE102}$ are base-to-emitter voltages of the transistors Q101 and Q102, and i is a current flowing through the common emitter resistor R101.

Supposing that a relationship of $Ri \gg (V_{BE101} - V_{BE102})$ is established, the current i is expressed as follows using the above relationship (2).

$$i = \frac{V_i - (V_{BE101} - V_{BE102})}{R} \approx \frac{V_i}{R} \tag{3}$$

The relationship (3) means that the current i is approximately proportional to the differential input voltage $V_i$.

The current i flowing through the emitter resistor R101 further flows the diode-connected transistors Q103 and Q104 as a differential current. Thus, if collector currents of the transistors Q101 and Q102 are defined as $I_{C101}$ and $I_{C102}$, respectively, the collector currents $I_{C101}$ and $I_{C102}$ are expressed as $$I_{C101} = I_0 + i \tag{4}$$

$$I_{C102} = I_0 - i \tag{5}$$

Therefore, the following relationships, (6) and (7) are established using the above expression (1b).

$$V_{BE101} = V_{BE103} = V_T \ln\left(\frac{I_0 + i}{I_S}\right) \quad (6)$$

$$V_{BE102} = V_{BE104} = V_T \ln\left(\frac{I_0 - i}{I_S}\right) \quad (7)$$

Thus, from the relationships (6) and (7), the difference $\Delta V_{BE}$ between the base-to-emitter voltages $V_{BE101}$ and $V_{BE102}$ is given by the following expression (8).

$$\Delta V_{BE} = V_{BE101} - V_{BE102} = V_{BE103} - V_{BE104} = V_T \ln\left(\frac{I_0 + i}{I_0 - i}\right) \quad (8)$$

It is seen from the expression (8) that the voltage difference $\Delta V_{BE}$ is in a logarithmically compressed form of the current i. This means that the voltage difference $\Delta V_{BE}$ is logarithmically proportional to the current i.

The voltage difference $\Delta V_{BE}$ is then applied across the bases of the transistors Q105 and Q106 of the second balanced differential pair and is amplified. Thus, the differential output current $\Delta I_C$ of the second balanced differential pair, which is an amplified output signal of $\Delta V_{BE}$, is given as $$\Delta I_C = I_{C105} - I_{C106} = I_1 \tanh\left(\frac{\Delta V_{BE}}{2V_T}\right) \quad (9)$$

The relationship (9) is obtained by the known result that a differential output current $\Delta I$ of a balanced differential pair of two emitter-coupled bipolar transistors driven by a constant current $I_x$ is expressed as $$\Delta I = I_x \tanh\left(\frac{V_{IN}}{2V_T}\right) \quad (9')$$

where $V_{IN}$ is a differential input voltage applied across the bases of the two bipolar transistors.

It is seen from the relationship (9) that the differential output current $\Delta I_C$ is in an exponentially expanded form of the inputted voltage difference $\Delta V_{BE}$.

The above relationship (9) is rewritten to the following expression (10a) using the above expression (8).

$$\Delta I_C = I_1 \tanh\left[\frac{1}{2}\ln\left(\frac{I_0 + i}{I_0 - i}\right)\right] \quad (10a)$$

This expression (10a) can be further rewritten to as follows.

$$\Delta I_C = I_1\left(\frac{i}{I_0}\right) \quad (10b)$$

Thus, it is seen from the expression (10b) that the output current $\Delta I_C$ is proportional to the current i flowing through the emitter resistor R101. This means that the current i can be derived from the collectors of the transistors Q105 and Q106. On the other hand, as described previously with reference to the expression (3), the current i is approximately proportional to the differential input voltage $V_i$.

Accordingly, the output current $\Delta I_C$ is proportional to the differential input voltage $V_i$. This means that the circuit in FIG. 1 has a linear transconductance and is capable of an OTA function.

With the conventional Gilbert gain cell in FIG. 1, using the above expression (10b) the collector currents $I_{C105}$ and $I_{C106}$ of the transistors Q105 and Q106 are expressed as the following equations (11) and (12), respectively.

$$I_{C105} = \frac{I_1}{2}\left(1 + \frac{i}{I_0}\right) \quad (11)$$

$$I_{C106} = \frac{I_1}{2}\left(1 - \frac{i}{I_0}\right) \quad (12)$$

On the other hand, from the above relationships (4) and (5), collector currents $I_{C101}$, and $I_{C102}$ of the transistors Q101 and Q102 are expressed as $$I_{C101} = I_0 + i = I_0\left(1 + \frac{i}{I_0}\right) \quad (13)$$

$$I_{C102} = I_0 - i = I_0\left(1 - \frac{i}{I_0}\right) \quad (14)$$

Therefore, it is seen from the equations (11), (12), (13), and (14) that the collector currents $I_{C105}$ and $I_{C106}$ of the transistors Q105 and Q106 are equal to the results obtained by multiplying $I_{C101}$ and $I_{C102}$ by $(I_1/2I_0)$, respectively. This means that no improvement is realized for the transconductance linearity in the conventional Gilbert gain cell.

Further, the conventional Gilbert gain call contains the arithmetic approximation as shown in the above equation (3), and as a result, a completely linear transconductance is unable to be realized. Satisfactory linearity in the OTA behavior can be realized only when the value of the resistance R of the emitter resistor R101 and the values of the constant currents $I_0$ and $I_1$ are suitably designed.

A significant problem of the conventional Gilbert gain cell is that the signal-to-noise ratio (S/N) is remarkably degraded, which is due to the logarithmic compression and exponential expansion of the input voltage $V_i$.

An OTA is an essential, basic function block in analog signal applications. Recently, fabrication processes for large-scale integrated circuits (LSIs) have been becoming finer and finer and as a result, the supply voltage for the LSIs has been decreasing from 5 V to 3 V, or lower. This tendency has been lowering the input signal level and necessitating the higher S/N level.

SUMMARY OF THE INVENTION

Accordingly, an object of the present invention is to provide an OTA having an improved S/N level.

Another object of the present invention is to provide an OTA capable of easy control of an OTA output.

Still another object of the present invention is to provide an output circuit for an OTA that facilitates the control of an OTA output.

The above objects together with others not specifically mentioned will become clear to those skilled in the art from the following description.

According to a first aspect of the present invention, an OTA is provided, which includes first, second, and third balanced differential pairs.

The first differential pair is formed by first and second bipolar transistors whose emitters are connected to first and second constant current sources/sinks supplying/sinking first and second constant currents, respectively. The first and second transistors are driven by the first and second constant currents, respectively. The emitter of the first transistor is connected to the emitter of the second transistor through a common emitter resistor.

The second differential pair is formed by third and fourth transistors whose emitters are coupled together to be connected to a collector of the first transistor. The second differential pair is driven by a collector current of the first transistor.

The third differential pair is formed by fifth and sixth transistors whose emitters are coupled together to be connected to a collector of the second transistor. The third differential pair is driven by a collector current of the second transistor.

A control voltage is applied across bases of the third and fourth transistors of the second differential pair. The control voltage is applied across bases of the fifth and sixth transistors of the third differential pair.

A differential input voltage is applied across bases of the first and second transistors of the first differential pair.

An OTA output is derived from at least one of the collectors of the third and fifth transistors.

With the OTA according to the first aspect of the present invention, the second differential pair formed by the emitter-coupled third and fourth transistors is driven by the collector current of the first transistor. The third differential pair formed by the emitter-coupled fifth and sixth transistors is driven by the collector current of the second transistor. Further, the OTA output is derived from at least one of the collectors of the third and fifth transistors.

Therefore, the OTA output is given without logarithmic compression nor exponential expansion. This means that no S/N degradation occurs due to logarithmic compression nor exponential expansion of the input voltage.

As a result, the OTA according to the first aspect of the present invention has an improved S/N level.

Additionally, the control voltage is applied across the bases of the third and fourth transistors of the second balanced differential pair and the bases of the fifth and sixth transistors of the third balanced differential pair. Therefore, if the control voltage is changed, the collector currents of the third and fifth transistors will vary according to the change of the control voltage, resulting in change of the OTA output.

Thus, the OTA output is able to be easily controlled by changing the control voltage.

In a preferred embodiment of the OTA according to the first aspect, a current mirror circuit is further provided as an active load of the third and fifth transistors. The OTA output is derived through the current mirror circuit. In this embodiment, there is an additional advantage of a simple circuit configuration.

In another preferred embodiment of the OTA according to the first aspect, the other terminals of the first and second constant current sources/sinks are kept at a first fixed voltage, and collectors of the fourth and sixth transistors are kept at a second fixed voltage.

In still another preferred embodiment of the OTA according to the first aspect, fourth and fifth differential pairs and a bias voltage source are further provided.

The fourth differential pair is formed by seventh and eighth bipolar transistors whose emitters are coupled together to be connected to one terminal of a third constant current source/sink supplying/sinking a third constant current. The fourth differential pair is driven by the third constant current. Collectors of the seventh and eighth transistors are connected to collectors of the third and fourth transistors, respectively. The control voltage is applied across bases of the seventh and eighth transistors of the fourth differential pair.

The fifth differential pair is formed by ninth and tenth bipolar transistors whose emitters are coupled together to be connected to one terminal of a fourth constant current source/sink supplying/sinking a fourth constant current. The fifth differential pair is driven by the fourth constant current. Collectors of the ninth and tenth transistors are connected to collectors of the fifth and sixth transistors, respectively. The control voltage is applied across bases of the ninth and tenth transistors of the fifth balanced differential pair.

The seventh, eighth, ninth, and tenth transistors are opposite in polarity to the third, fourth, fifth, and sixth transistors.

The bias voltage source supplies a dc bias voltage to the coupled collectors of the fourth and eighth transistors and the coupled collectors of the sixth and tenth transistors, respectively.

In this case, there is an additional advantage that the OTA output is derived from any one of the collectors of the third and fifth transistors.

According to a second aspect of the present invention, an output circuit for an OTA is provided, which includes first and second differential pairs.

The first differential pair is formed by first and second bipolar transistors whose emitters are coupled together to form a first input terminal of the output circuit. The second differential pair is formed by third and fourth bipolar transistors whose emitters are coupled together to form a second input terminal of the output circuit.

The first and second input terminals of the output circuit are applied with first and second differential output currents from an OTA core circuit. Each of the first and second differential output currents from the OTA core circuit is proportional to an input voltage for the OTA core circuit.

A control voltage is applied across bases of the first and second transistors of the first differential pair. The control voltage is applied across bases of the third and fourth transistors of the second differential pair.

An OTA output is derived from at least one of the collectors of the third and fifth transistors.

With the output circuit according to the second aspect of the present invention, the first and second input terminals of the output circuit are applied with the first and second differential output currents from the OTA core circuit, respectively. Therefore, the first and second differential pairs are driven by the first and second differential output currents from the OTA core circuit, respectively.

Further, the control voltage is applied across the bases of the first and second transistors of the first differential pair and the bases of the third and fourth transistors of the second differential pair, respectively. Accordingly, if the control voltage is changed, the collector currents of the first and third transistors will vary according to the change of the control voltage, resulting in change of the OTA output.

Thus, the OTA output is able to be controlled by changing the control voltage. This means that the control of the OTA output is facilitated.

In a preferred embodiment of the output circuit according to the second aspect, a current mirror circuit is further provided as an active load of the first and third transistors. The OTA output is derived through the current mirror circuit.

In another preferred embodiment of the OTA according to the second aspect, collectors of the second and fourth transistors are kept at a fixed voltage.

In still another preferred embodiment of the output circuit according to the second aspects third and fourth differential pairs and a bias voltage source are further provided.

The third differential pair is formed by fifth and sixth bipolar transistors whose emitters are coupled together to be connected to one terminal of a first constant current source/sink supplying/sinking a first constant current. The third differential pair is driven by the first constant current. Collectors of the fifth and sixth transistors are connected to collectors of the first and second transistors, respectively. The control voltage is applied across bases of the fifth and sixth transistors of the third differential pair.

The fourth balanced differential pair is formed by seventh and eighth bipolar transistors whose emitters are coupled together to be connected to one terminal of a second constant current source/sink supplying/sinking a second constant current. The fourth balanced differential pair is driven by the second constant current. Collectors of the seventh and eighth transistors are connected to collectors of the third and fourth transistors, respectively. The control voltage is applied across bases of the seventh and eighth transistors of the fourth balanced differential pair.

The fifth, sixth, sevenths and eighth transistors are opposite in polarity to the first, second, third, and fourth transistors.

The bias voltage source supplies a dc bias voltage to the collectors of the second and fourth transistors and collectors of the sixth and eighth transistors, respectively.

BRIEF DESCRIPTION OF THE DRAWINGS

In order that the present invention may be readily carried into effects it will now be described with reference to the accompanying drawings.

DETAILED DESCRIPTION OF THE PREFERRED EMBODIMENTS

Figure 1:
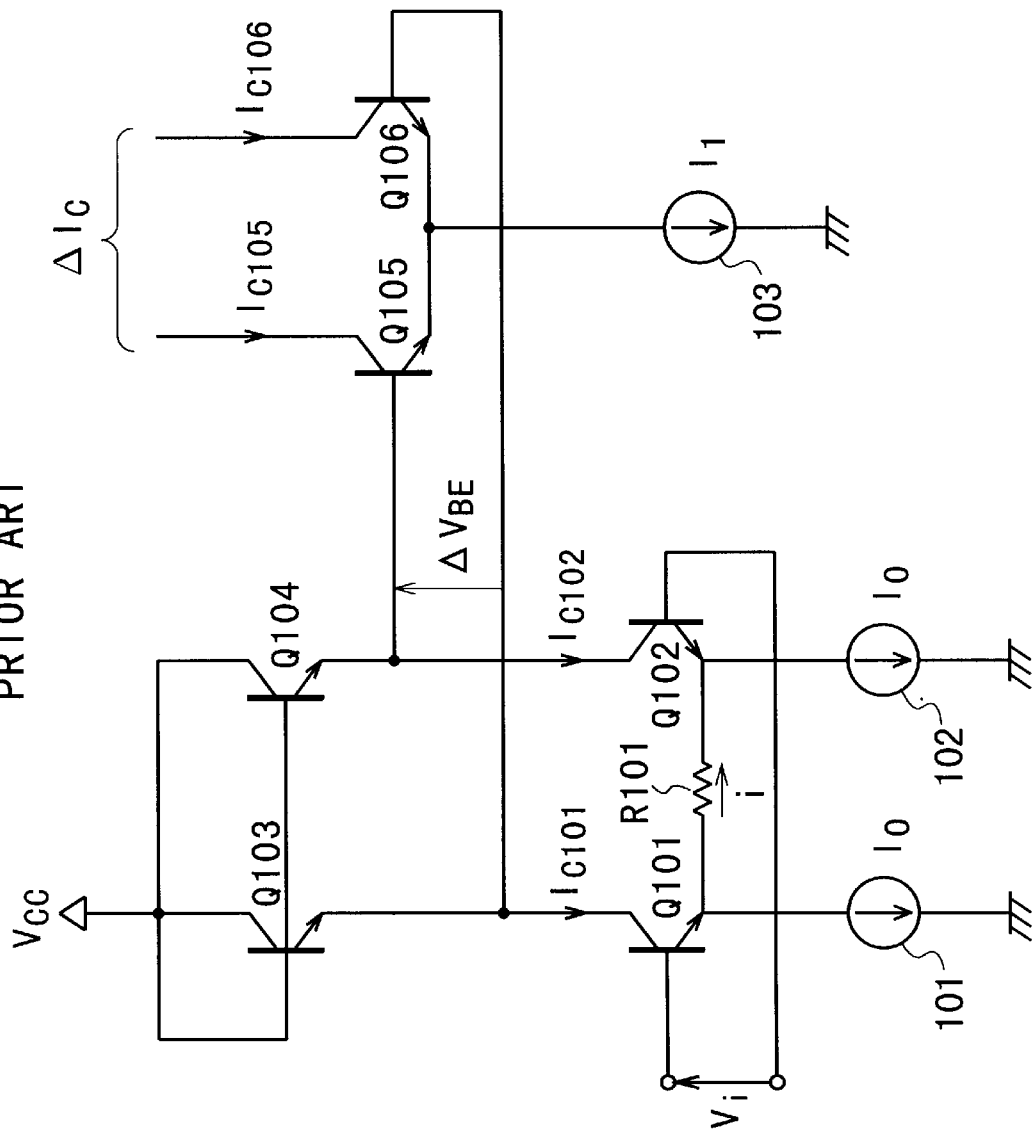
FIG. 1 is a circuit diagram of a conventional bipolar OTA termed the Gilbert gain cell.

Preferred embodiments of the present invention will be described in detail below while referring to the drawings attached.

FIRST EMBODIMENT

Figure 2:
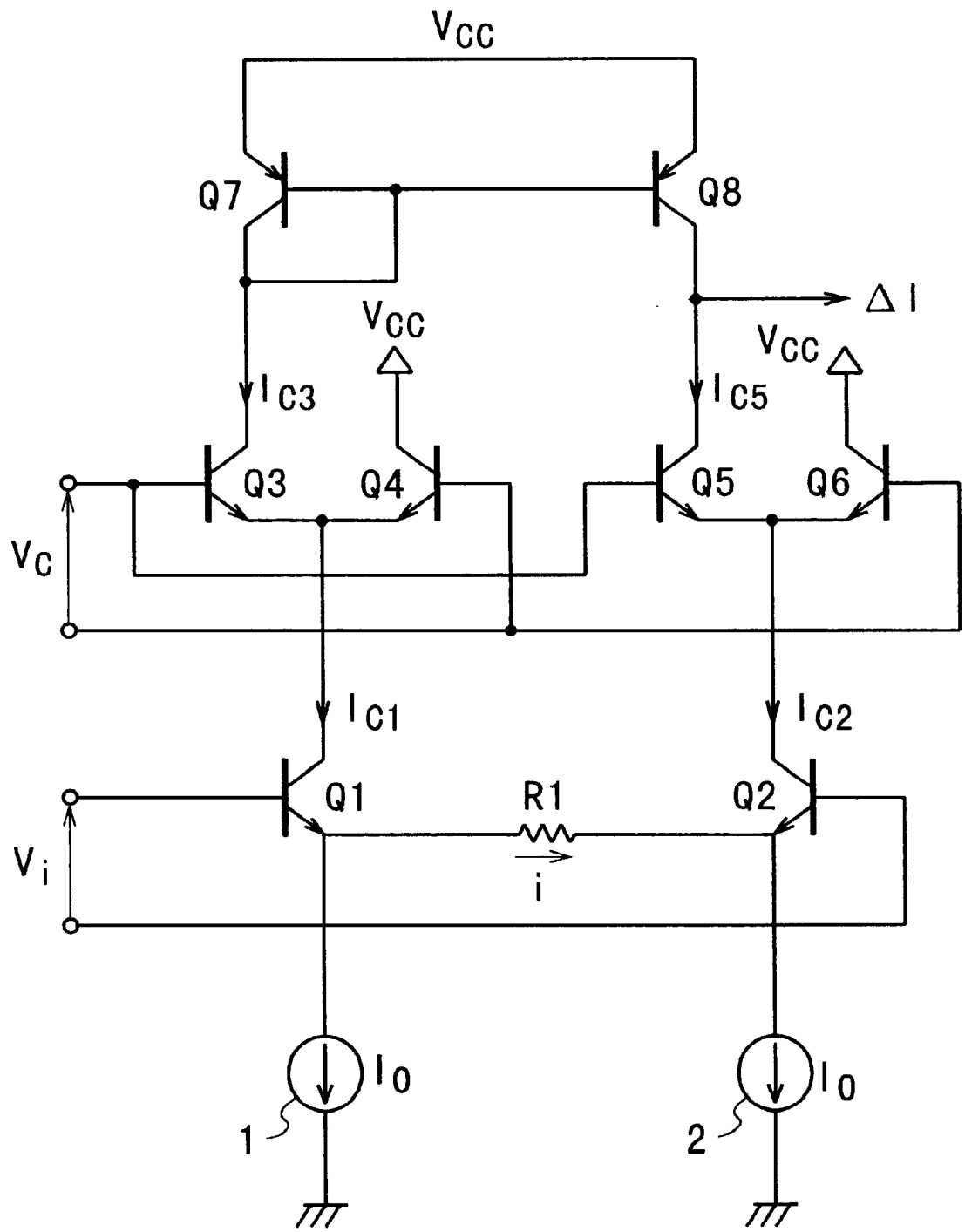
FIG. 2 is a circuit diagram of a bipolar OTA according to a first embodiment of the present invention.

An OTA according to a first embodiment of the present invention is shown in FIG. 2.

As shown in FIG. 2, this OTA includes a first balanced differential pair of npn bipolar transistors Q1 and Q2 whose emitter areas are equal to each other. Emitters of the transistors Q1 and Q2 are coupled together through a common emitter resistor R1 with a resistance R.

The emitter of the transistor Q1 is further connected to one terminal of a constant current sink 1 sinking a constant current $I_0$. The other terminal of the current sink 1 is connected to the ground. The emitter of the transistor Q2 is connected to one terminal of a constant current sink 2 sinking the same constant current $I_0$ as that of the current sink 1. The other terminal of the current sink 2 is connected to the ground. These two transistors Q1 and Q2 are driven by the same constant currents $I_0$, respectively.

A differential input voltage $V_i$ is applied across bases of the transistors Q1 and Q2. A current i will flow through the common emitter resistor R1 according to the value of the differential input voltage $V_i$.

The first balanced differential pair of the transistors Q1 and Q2 including the emitter resistor R1 constitutes an OTA core circuit. Collectors of the transistors Q1 and Q2 form a pair of output terminals of the OTA core circuit.

This OTA further includes an output circuit having second and third balanced differential pairs.

The second balanced differential pair is formed by npn bipolar transistors Q3 and Q4 whose emitter areas are equal to each other. The emitters of the transistors Q3 and Q4 are coupled together to be connected to the collector of the transistor Q1. No emitter resistor is provided to the emitters of the transistors Q3 and Q4. The second balanced differential pair is driven by a collector current $I_{C1}$ of the transistor Q1 serving as a differential output current of the OTA core circuit.

The third balanced differential pair is formed by npn bipolar transistors Q5 and Q6 whose emitter areas are equal to each other. The emitters of the transistors Q5 and Q6 are coupled together to be connected to the collector of the transistor Q2. No emitter resistor is provided to the emitters of the transistors Q5 and Q6. The third balanced differential pair is driven by a collector current $I_{C2}$ of the transistor Q2 serving as another differential output current of the OTA core circuit.

A control voltage $V_C$ is applied across bases of the transistors Q3 and Q4 of the second differential pair. The control voltage $V_C$ is further applied across bases of the transistors Q5 and Q6 of the third differential pair.

As an active load for the second and third balanced differential pairs, a current mirror circuit is further provided. This current mirror circuit is formed by a pnp bipolar transistor Q7 with a diode connection and a pnp bipolar transistor Q8 as a mirror transistor.

A base and a collector of the transistor Q7 is coupled together to be directly connected to a collector of the transistor Q3. An emitter of the transistor Q7 is directly applied with a power supply voltage $V_{CC}$.

A base of the transistor Q8 is connected to the base and collector of the transistor Q7. A collector of the transistor Q8 is directly connected to a collector of the transistor Q5. An emitter of the transistor Q8 is directly applied with the power supply voltage $V_{CC}$.

Collectors of the transistors Q4 and Q6 are directly applied with the power supply voltage $V_{CC}$.

A differential output current $\Delta I$ of the OTA according to the first embodiment is defined as the difference between collector currents $I_{C3}$ and $I_{C5}$ of the transistors Q3 and Q5, i.e., $\Delta I = I_{C3} - I_{C5}$. The differential output current $\Delta I$ is derived from the connection point of the collectors of the transistors Q5 and Q8.

In the OTA according to the first embodiment, the emitter areas of the transistors Q1 to Q8 are equal to each other.

Next, the operation of the bipolar OTA according to the first embodiment is explained below.

As clearly seen from FIG. 2, the first balanced differential pair of the transistors Q1 and Q2 including the common emitter resistor R1 (i.e., the OTA core circuit) is the same in configuration as that of the conventional Gilbert gain cell shown in FIG. 1. Therefore, in the same way as the previously-shown expressions (13) and (14) with reference to the conventional Gilbert gain cell, collector currents $I_{C1}$ and $I_{C2}$ of the transistors Q1 and Q2 are expressed as the following expressions (15) and (16), respectively.

$$I_{C1} = I_0 + i = I_0\left(1 + \frac{i}{I_0}\right) \tag{15}$$

$$I_{C2} = I_0 - i = I_0\left(1 - \frac{i}{I_0}\right) \tag{16}$$

The second differential pair of the transistors Q3 and Q4 is driven by the collector current $I_{C1}$ of the transistor Q1. Therefore, using the previously-shown expression (9'), the collector current $I_{C3}$ of the transistor Q3 is expressed as $$I_{C3} = (I_0 + i)\tanh\left(\frac{V_C}{2V_T}\right) \tag{17}$$

Similarly, the third differential pair of the transistors Q5 and Q6 is driven by the collector current $I_{C2}$ of the transistor Q2 Therefore, the collector current $I_{C5}$ of the transistor Q5 is expressed as $$I_{C5} = (I_0 - i)\tanh\left(\frac{V_C}{2V_T}\right) \tag{18}$$

As a result, the differential output current $\Delta I$ is expressed as $$\Delta I = I_{C3} - I_{C5} = 2i\tanh\left(\frac{V_C}{2V_T}\right) \tag{19}$$

It is seen from the expression (19) that the differential output current $\Delta I$ is proportional to the current i flowing through the emitter resistor R1.

Since the current i is proportional to the differential input voltage $V_i$, as seen from the previously-shown relationship (3), the differential output current $\Delta I$ is proportional to the differential input voltage $V_i$. As a result, this circuit is capable of an OTA function.

Further, it is seen from the expression (19) that the differential output current $\Delta I$ may have any value ranging from $-2i$ to $2i$.

As described above, with the bipolar OTA according to the first embodiment, the second differential pair formed by the emitter-coupled transistors Q3 and Q4 is driven by the collector current $I_{C1}$ of the transistor Q1. The third differential pair formed by the emitter-coupled transistors Q5 and Q6 is driven by the collector current $I_{C2}$ of the transistor Q2. Further, the OTA output is given by the difference $\Delta I$ between the collector currents $I_{C3}$ and $I_{C5}$ of the transistors Q3 and Q5.

Therefore, the OTA output (i.e., the differential output current $\Delta I$) is given without logarithmic compression nor exponential expansion. This means that no S/N degradation occurs due to logarithmic compression nor exponential expansion of the input voltage $V_i$.

As a result, the OTA according to the first embodiment has an improved S/N level. In other words, this OTA can provide very high value of S/N.

Additionally, the control voltage $V_C$ is applied across the bases of the transistors Q3 and Q4 of the second differential pair and the bases of the transistors Q5 and Q6 of the third differential pair. Therefore, if the control voltage $V_C$ is changed, the collector currents $I_{C3}$ and $I_{C5}$ of the transistors Q3 and Q5 will vary according to the change of the control voltage $V_C$, resulting in change of the OTA output $\Delta I$.

Thus, the OTA output $\Delta I$ is able to be easily controlled by changing the control voltage $V_C$.

Figure 3:
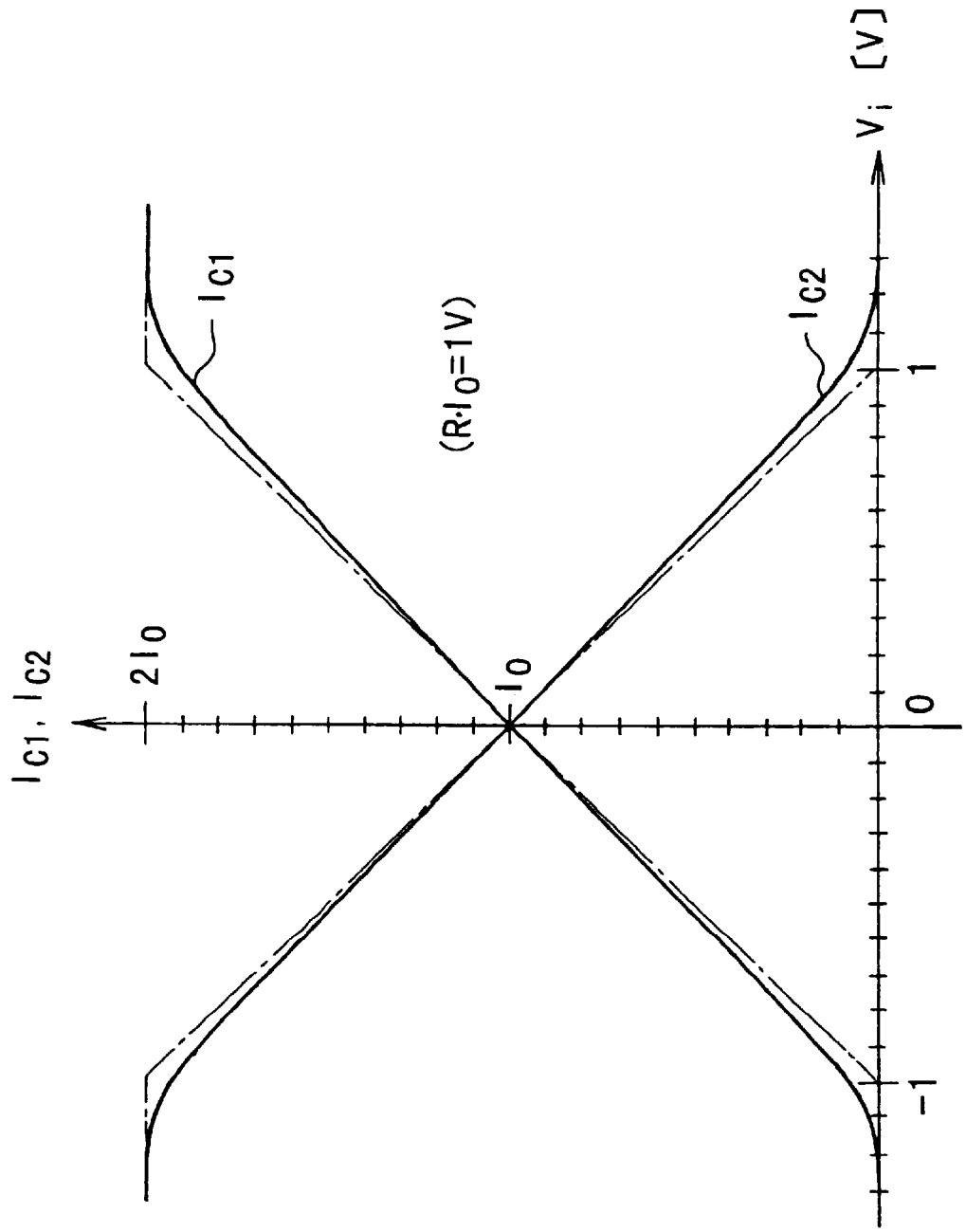
FIG. 3 is a graph showing the calculated transfer characteristics of the bipolar OTA according to the first embodiment in FIG. 2.

FIG. 3 shows the transfer characteristics of the OTA according to the first embodiment, where $I_0R=1$ (V) In FIG. 3, the abscissa axis indicates the differential input voltage $V_i$ and the ordinate axis indicates the collector currents $I_{C1}$ and $I_{C2}$ of the transistors Q1 and Q2. The chain lines in FIG. 3 indicate tangential lines for the curves $I_{C1}$ and $I_{C2}$, which are drawn at the point of $V_i=0$.

The deviation of the curves $I_{C1}$ and $I_{C2}$ from the corresponding tangential lines are caused by the voltage difference $\Delta V_{BE}$.

If the OTA according to the first embodiment is realized on an LSI, the value of the constant currents $I_0$ of the constant current sinks 1 and 2 and the value of the resistance R of the common emitter resistor R1 tend to fluctuate. In this case, the constant currents $I_0$ may be readily set as a wanted, specific value, which has been popularly performed in practical use.

However, the resistance R is difficult to be set as a wanted, specific value. Especially, as seen from the above expression (19), the differential output current $\Delta I$ is proportional to the current i flowing through the emitter resistor R1. Also, the current i is determined by the resistance R of the resistor R1, as shown in the above expression (3).

Accordingly, the output circuit, which includes the second differential pair of the transistors Q3 and Q4 and the third differential pair of the transistors Q5 and Q6, is essential in practical use for setting or determining the current i and the differential output current $\Delta I$ as wanted, specific values, respectively.

With the OTA according to the first embodiment, the differential output current $\Delta I$ contains the control voltage $V_C$ of the output circuit, as shown in the expression (19). Therefore, even if the value of the current i fluctuates due to the variation of the resistance value R of the emitter resistor R1, the fluctuation of the differential output current $\Delta I$ is able to be compensated by suitably adjusting the control voltage $V_C$.

Thus, the differential output current $\Delta I$ may be set as a specific, wanted value even on an LSI.

The output circuit of the OTA according to the first embodiment changes the collector currents $I_{C3}$ and $I_{C5}$ by the control voltage $V_C$ and therefore, it is said that this circuit has a variable-current distribution function.

SECOND EMBODIMENT

Figure 4:
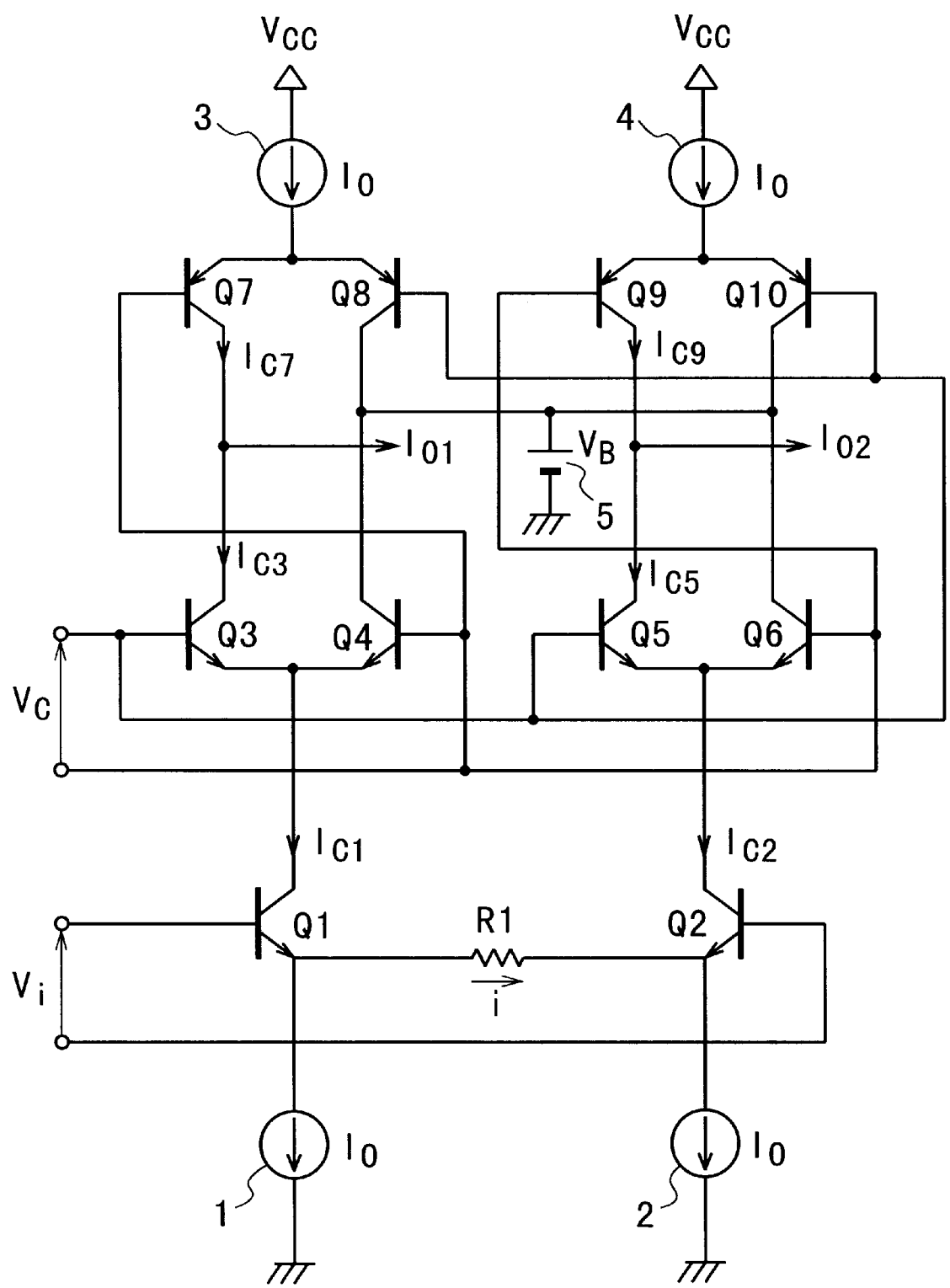
FIG. 4 is a circuit diagram of a bipolar OTA according to a second embodiment of the present invention.

An OTA according to a second embodiment of the present invention is shown in FIG. 4. This OTA has the same configurations as those in the first differential pair of the transistors Q1 and Q2, the second differential pair of the transistors Q3 and Q4, and the third differential pair of the transistors Q5 and Q6.

Therefore, the description about the same configurations is omitted here by adding the same reference characters or numerals as those in FIG. 4 to the same elements for the sake of simplification.

In the second embodiment, the output circuit further includes a fourth balanced differential pair of seventh and eighth pnp bipolar transistors Q7 and Q8, a fifth balanced differential pair of ninth and tenth pnp bipolar transistors Q9 and Q10, and a bias voltage source 5, in addition to the second and third differential pairs.

The transistors Q7 and Q8 forming the fourth differential pair have emitters coupled together to be connected to one terminal of a constant current source 3 supplying the same constant current $I_0$ as those of the constant current sinks 1 and 2. The fourth differential pair is driven by the constant current $I_0$. The other terminal of the constant current source 3 is directly applied with the power supply voltage $V_{CC}$.

Collectors of the transistors Q7 and Q8 are directly connected to the collectors of the transistors Q3 and Q4, respectively. The control voltage $V_C$ is applied across bases of the transistors Q7 and Q8.

The transistors Q9 and Q10 forming the fifth differential pair have emitters coupled together to be connected to one terminal of a constant current source 4 supplying the same constant current $I_0$ as those of the constant current sinks 1 and 2. The fifth differential pair is driven by the constant current $I_0$. The other terminal of the constant currant source 4 is directly applied with the power supply voltage $V_{CC}$.

Collectors of the transistors Q9 and Q10 are directly connected to the collectors of the transistors Q5 and Q6, respectively. The control voltage $V_C$ is applied across bases of the transistors Q9 and Q10.

A positive terminal of the bias voltage source 5 is connected to the collectors of the transistors Q4 and Q8 and the collectors of the transistors Q6 and Q10, respectively. A negative terminal of the voltage source 5 is connected to the ground. Thus, the constant bias voltage $V_b$ is applied to the coupled collectors of the transistors Q4 and Q8 and the coupled collectors of the transistors Q6 and Q10, respectively.

A first output current $I_{O1}$ of the OTA is derived from the coupled collectors of the transistors Q3 and Q7. At the same time, a second output current $I_{O2}$ of the OTA is derived from the coupled collectors of the transistors Q5 and Q9.

Therefore, unlike the first embodiment, two output signals are obtained from the coupled collectors of the transistors Q3 and Q7 and the coupled collectors or the transistors Q5 and Q9, respectively. In other words, there is no need that the difference between the collector currents $I_{C3}$ and $I_{C5}$ is generated as the output of the OTA. This is an additional advantage in the second embodiment.

In the second embodiment, the emitter areas of the transistors Q1 to Q10 are equal to each other.

Next, the operation of the bipolar OTA according to the second embodiment is explained below.

The fourth differential pair of the transistors Q7 and Q8 is driven by the constant current $I_0$ of the constant current source 3. Therefore, using the previously-shown expression (9'), the collector current $I_{C7}$ of the transistor Q7 is expressed as $$I_{C7} = I_0 \tanh\left(\frac{V_C}{2V_T}\right) \quad (20)$$

Similarly, the fifth differential pair of the transistors Q9 and Q10 is driven by the constant current I0 of the constant current source 4. Therefore, the collector current $I_{C9}$ of the transistor Q9 is expressed as $$I_{C9} = I_0 \tanh\left(\frac{V_C}{2V_T}\right) \quad (21)$$

As a result, the first output current $I_{O1}$ of the OTA is expressed as $$I_{O1} = I_{C7} - I_{C3} = -i \tanh\left(\frac{V_C}{2V_T}\right) \quad (22)$$

Similarly, the second output current $I_{O2}$ or the OTA is expressed as $$I_{O2} = I_{C9} - I_{C5} = i \tanh\left(\frac{V_C}{2V_T}\right) \quad (23)$$

It is seen from the expressions (22) and (23) that the first and second output currents $I_{O1}$ and $I_{O2}$ are proportional to the current i flowing through the emitter resistor R1, respectively. As a result, this circuit is capable of an OTA function.

It is seen from the expressions (22) and (23) that the first and second output currents $I_{O1}$ and $I_{O2}$ each may have any value ranging from −i to i.

As described above, with the bipolar OTA according to the second embodiment, the same advantages as those in the first embodiment are obtained.

The output circuit of the OTA according to the second embodiment changes the collector currents $I_{C3}$ and $I_{C7}$ and $I_{C5}$ and $I_{C9}$ by the control voltage $V_C$ and therefore, it is said that this circuit has a variable-current distribution function.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. An operational transconductance amplifier comprising:
   (a) a first differential pair formed by first and second bipolar transistors whose emitters are connected to first and second constant current sources/sinks supplying/sinking first and second constant currents, respectively;
   said first and second transistors being driven by said first and second constant current sources/sinks, respectively;
   said emitter of said first transistor being connected to said emitter of said second transistor through a single common emitter resistor;
   (b) a second differential pair formed by third and fourth transistors whose emitters are coupled together to be connected to a collector of said first transistor;
   said second differential pair being driven by a collector current of said first transistor;
   (c) a third differential pair formed by fifth and sixth transistors whose emitters are coupled together to be connected to a collector of said second transistor;
   said third differential pair being driven by a collector current of said second transistor;
   (d) a control voltage being applied across bases of said third and fourth transistors of said second differential pair and bases of said fifth and sixth transistors of said third differential pair, respectively;
   (e) a differential input voltage being applied across bases of said first and second transistors of said first differential pair; and (f) an operational transconductance amplifier output being derived from at least one of said collectors of said third and fifth transistors.

2. An operational transconductance amplifier as claimed in claim 1, further comprising a current mirror circuit as an active load of said third and fifth transistors;

wherein said operational transconductance amplifier output is derived through said current mirror circuit.

3. An operational transconductance amplifier as claimed in claim 1, wherein the other terminals of said first and second constant current sources/sinks are kept at a first fixed voltage;

and wherein collectors of said fourth and sixth transistors are kept at a second fixed voltage.

4. An operational transconductance amplifier comprising:

(a) a first differential pair formed by first and second bipolar transistors whose emitters are connected to first and second constant current sources/sinks supplying/sinking first and second constant currents, respectively; said first and second transistors being driven by said first and second constant current sources/sinks, respectively;

said emitter of said first transistor being connected to said emitter of said second transistor through a common emitter resistor;

(b) a second differential pair formed by third and fourth transistors whose emitters are coupled together to be connected to a collector of said first transistor; said second differential pair being driven by a collector current of said first transistor;

(c) a third differential pair formed by fifth and sixth transistors whose emitters are coupled together to be connected to a collector of said second transistor; said third differential pair being driven by a collector current of said second transistor;

(d) a control voltage being applied across bases of said third and fourth transistors of said second differential pair and bases of said fifth and sixth transistors of said third differential pair, respectively;

(e) a differential input voltage being applied across bases of said first and second transistors of said first differential pair;

(f) an operational transconductance amplifier output being derived from at least one of said collectors of said third and fifth transistors;

(g) a fourth differential pair;

(h) a fifth differential pair; and (i) a bias voltage source;

wherein said fourth differential pair is formed by seventh and eighth bipolar transistors whose emitters are coupled together to be connected to one terminal of a third constant current source/sink supplying/sinking a third constant current;

said fourth differential pair being driven by said third constant current;

collectors of said seventh and eighth transistors being connected to collectors os said third and fourth transistors, respectively;

said control voltage being applied across bases of said seventh and eighth transistors of said fourth differential pair;

and wherein said fifth differential pair is formed by ninth and tenth bipolar transistors whose emitters are coupled together to be connected to one terminal of a fourth constant current source/sink supplying/sinking a fourth constant current;

said fifth differential pair being driven by said fourth constant current;

collectors of said ninth and tenth transistors being connected to collectors of said fifth and sixth transistors, respectively;

said control voltage being applied across bases of said ninth and tenth transistors of said fifth differential pair; and wherein said seventh, eighth, ninth and tenth transistors are opposite in polarity to said third, fourth, fifth, and sixth transistors; and wherein said bias voltage source supplies a dc bias voltage to said coupled collectors of said fourth and eighth transistors and said coupled collectors of said sixth and tenth transistors, respectively.

5. An operational transconductance amplifier as claimed in claim 1, wherein each of said first and second constant currents of said first and second constant current sources/sinks is $I_0$, and a current i flows through said single common emitter resistor according to said differential input voltage;

wherein said collector current of said first transistors is expressed as $(I_0+i)$ and said collector current of said second transistors is expressed as $(I_0-i)$.

6. An output circuit for an operational transconductance amplifier, said circuit comprising:

a first differential pair formed by first and second bipolar transistors whose emitters are coupled together to form a first input terminal of said output circuit;

a second differential pair formed by third and fourth bipolar transistors whose emitters are coupled together to form a second input terminal of said output circuit;

said first and second input terminals of said output circuit being applied with first and second differential output currents from an operational transconductance amplifier core circuit;

each of said first and second differential output currents from said operational transconductance amplifier core circuit being proportional to an input voltage for said operational transconductance amplifier core circuit;

a control voltage being applied across bases of said first and second transistors of said first differential pair;

said control voltage being applied across bases of said third and fourth transistors of said second differential pair; and an operational transconductance amplifier output being derived from at least one of said collectors of said third and fifth transistors.

7. An output circuit as claimed in claim 6, further comprising a current mirror circuit as an active load of said first and third transistors;

wherein said operational transconductance amplifier output is derived through said current mirror circuit.

8. An output circuit as claimed in claim 6, wherein collectors of said second and fourth transistors are kept at a fixed voltage.

9. An output circuit for an operational transconductance amplifier, said circuit comprising:

a first differential pair formed by first and second bipolar transistors whose emitters are coupled together to form a first input terminal of said output circuit;

a second differential pair formed by third and fourth bipolar transistors whose emitters are coupled together to form a second input terminal of said output circuit;

said first and second input terminals of said output circuit being applied with first and second differential output currents from an operational transconductance amplifier core circuit;

each of said first and second differential output current from said operational transconductance amplifier core circuit being proportional to an input voltage for said operational transconductance amplifier core circuit;

a control voltage being applied across bases of said first and second transistors of said first differential pair;

said control voltage being applied across bases of said third and fourth transistors of said second differential pair; and an operational output being derived from at least one of said collectors of said third and fifth transistors;

a third differential pair;

a fourth differential pair; and a bias voltage source;

wherein said third differential pair is formed by fifth and sixth bipolar transistors whose emitters are coupled together to be connected to one terminal of a first constant current source/sink supplying/sinking a first constant current;

said third differential pair being driven by said first constant current;

collectors of said fifth and sixth transistors being connected to collectors of said first and second transistors, respectively;

said control voltage being applied across bases of said fifth and sixth transistors of said third differential pair;

and wherein said fourth differential pair is formed by seventh and eighth bipolar transistors whose emitters are coupled together to be connected to one terminal of a second constant current source/sink supplying/sinking a second constant current;

said fourth differential pair being driven by said second constant current;

collectors of said seventh and eighth transistors being connected to collectors of said third and fourth transistors, respectively;

said control voltage being applied across bases of said seventh and eighth transistors of said fourth differential pair; and wherein said fifth, sixth, seventh, and eight transistors are opposite in polarity to said first, second, third, and fourth transistors; and wherein said bias voltage source supplies a dc bias voltage to said collectors of said second and fourth transistors and collectors of said sixth and eighth transistors, respectively.

10. The operational transconductance amplifier of claim 1, wherein said common emitter resistor has a first end a second end, said first end being directly connected to said emitter of said first transistor and said second end being directly connected to said emitter of said second transistor.

* * * * *